US012604747B2

(12) United States Patent (10) Patent No.: US 12,604,747 B2
Cheah et al. (45) Date of Patent: Apr. 14, 2026

(54) OPOSSUM REDISTRIBUTION FRAME FOR CONFIGURABLE MEMORY DEVICES

(71) Applicant: Intel Corporation, Santa Clara, CA (US)

(72) Inventors: Bok Eng Cheah, Gelugor Pulau Pinang (MY); Seok Ling Lim, Kulim Kedah (MY); Jenny Shio Yin Ong, Bayan Lepas Pulau Pinang (MY); Jackson Chung Peng Kong, Tanjung Tokong Pulau Pinang (MY); Kooi Chi Ooi, Gelugor Pulau Pinang (MY)

(73) Assignee: Intel Corporation, Santa Clara, CA (US)

( * ) Notice: Subject to any disclaimer, the term of this patent is extended or adjusted under 35 U.S.C. 154(b) by 1134 days.

(21) Appl. No.: 17/368,837

(22) Filed: Jul. 7, 2021

(65) Prior Publication Data

US 2021/0335718 A1     Oct. 28, 2021

(51) Int. Cl.
H01L 23/538 (2006.01)
H01L 21/48 (2006.01)
(Continued)

(52) U.S. Cl.
CPC ...... H01L 23/5386 (2013.01); H01L 21/4853 (2013.01); H01L 21/4857 (2013.01);
(Continued)

(58) Field of Classification Search
CPC ............. H01L 23/5386; H01L 21/4853; H01L 21/4857; H01L 23/13; H01L 23/5383;
H01L 23/5385; H01L 24/16; H01L 25/0652; H01L 25/50; H01L 2224/16157; H01L 2225/06517; H01L 2225/0652; H01L 2225/06558; H01L 2225/06572; H01L 2924/1205; H01L 2924/1206; H01L 2924/1207; H01L 2924/1427; H01L 2924/1431; H01L 2924/1436; H01L 2924/19106; H01L 24/13; H01L 23/642; H01L 25/105; H01L 2224/131; H01L 2224/16227; H01L 2224/81005; H01L 2225/06586; H01L 2225/1023;
(Continued)

(56) References Cited

U.S. PATENT DOCUMENTS 8,411,459 B2 * 4/2013 Yu ..................... H01L 23/49827
361/783
2016/0372448 A1 * 12/2016 Yazdani .................. H01L 23/04
(Continued)

*Primary Examiner* — Mohammad M Hoque
(74) *Attorney, Agent, or Firm* — Viering, Jentschura & Partner mbB

(57) ABSTRACT

The present disclosure relates to a semiconductor package that may include a package substrate with a first surface and an opposing second surface, a first device coupled to the first surface of the package substrate, a redistribution frame coupled to the second surface of the package substrate, a plurality of solder balls coupled to the second surface of the package substrate, a second device coupled to the redistribution frame, and a printed circuit board coupled to the plurality of solder balls on the second surface of substrate, wherein the redistribution frame coupled with the second device and the plurality of solder balls are positioned between the package substrate and the printed circuit board.

19 Claims, 16 Drawing Sheets

(51) Int. Cl.

| | | |
|---|---|---|
| *H01L 23/00* | (2006.01) |
| *H01L 23/13* | (2006.01) |
| *H01L 25/00* | (2006.01) |
| *H01L 25/065* | (2023.01) |

(52) U.S. Cl.
CPC .......... *H01L 23/13* (2013.01); *H01L 23/5383* (2013.01); *H01L 23/5385* (2013.01); *H01L 24/16* (2013.01); *H01L 25/0652* (2013.01); *H01L 25/50* (2013.01); *H01L 2224/16157* (2013.01); *H01L 2225/06517* (2013.01); *H01L 2225/0652* (2013.01); *H01L 2225/06558* (2013.01); *H01L 2225/06572* (2013.01); *H01L 2924/1205* (2013.01); *H01L 2924/1206* (2013.01); *H01L 2924/1207* (2013.01); *H01L 2924/1427* (2013.01); *H01L 2924/1431* (2013.01); *H01L 2924/1436* (2013.01); *H01L 2924/19106* (2013.01)

(58) Field of Classification Search
CPC ....... H01L 2225/1058; H01L 2225/107; H01L 2924/19041; H01L 2924/15159; H01L 2924/15311; H01L 2924/19042; H01L 2924/19043
USPC .......................................................... 257/668
See application file for complete search history.

(56) References Cited

U.S. PATENT DOCUMENTS

2021/0307218 A1* 9/2021 Paynter ................. H01L 25/105
2022/0068736 A1* 3/2022 Lo ........................... H01L 24/81

* cited by examiner

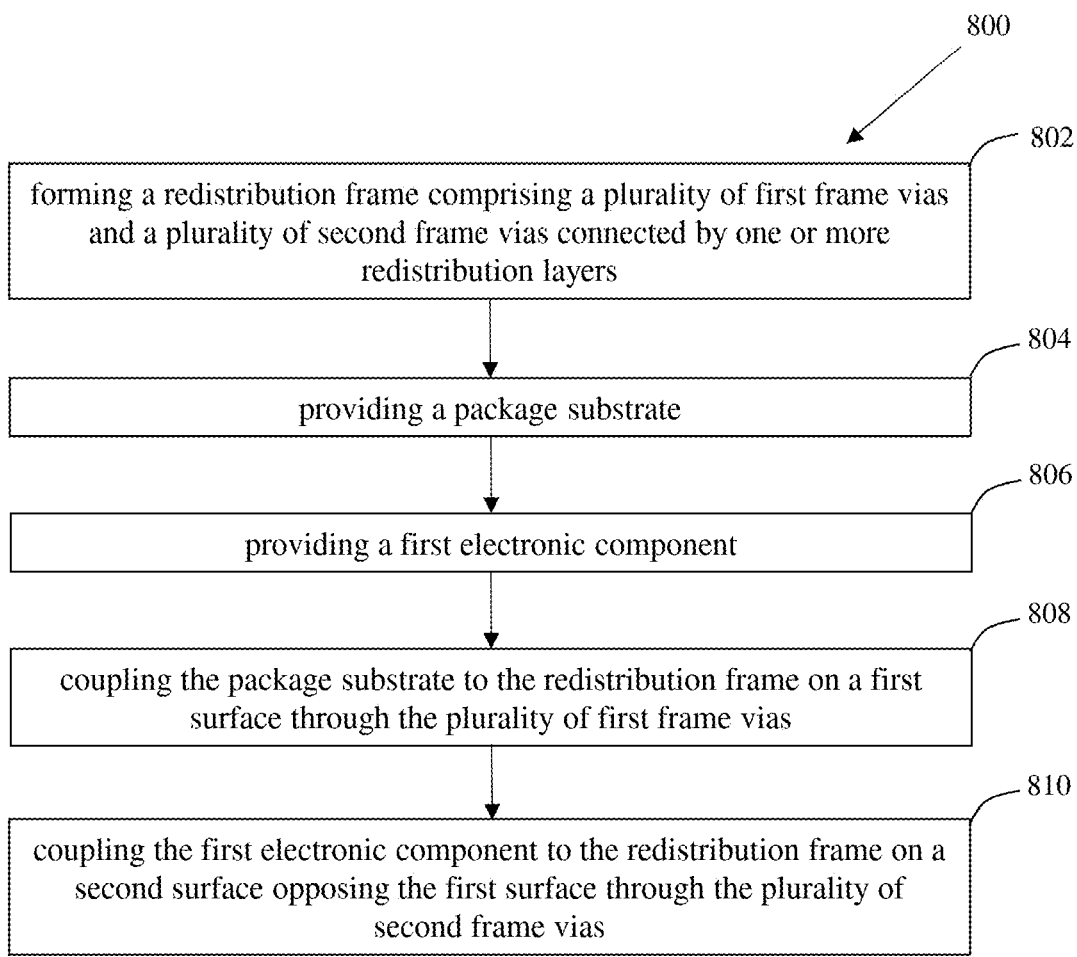

800

802 forming a redistribution frame comprising a plurality of first frame vias and a plurality of second frame vias connected by one or more redistribution layers

804 providing a package substrate

806 providing a first electronic component

808 coupling the package substrate to the redistribution frame on a first surface through the plurality of first frame vias

810 coupling the first electronic component to the redistribution frame on a second surface opposing the first surface through the plurality of second frame vias

FIG. 8

OPOSSUM REDISTRIBUTION FRAME FOR CONFIGURABLE MEMORY DEVICES

BACKGROUND

Current solutions to address memory bandwidth density scaling include integration of memory package adjacent to central processing unit or system-on-chip (SOC) devices on package top surface for data-rate scaling.

Alternatively, 2.5D and/or 3D integrated circuit packagings are being explored to reduce signal latency between processors, e.g., central processing unit (CPU)/graphic processing unit (GPU) and memory devices for computing performance scaling. Solutions to address electrical impairments of advanced memory technology include increased package layer count and/or real-estate for trace spacing between adjacent interconnects, e.g., at silicon bump or solder ball breakout segments for improved electromagnetic noise shielding or coupling noise reduction.

Integration of dynamic random-access memory (DRAM) packages on the top side of a SOC package for signal latency reduction includes package real-estate and package layer count (z-height) trade-off due to the placement of DRAM packages lateral to the SOC die(s) and the required footprint for DRAM signal breakout; trade-off for 2.5D and/or 3D packaging solutions includes increased power loop inductance, introduction of high resistance through silicon via (TSV) interconnects (power integrity trade-off), package form-factor expansion and/or warpage control challenges. Increased package layer count and/or footprint for electromagnetic noise coupling mitigation includes package form-factor expansion trade-off.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the present disclosure. The dimensions of the various features or elements may be arbitrarily expanded or reduced for clarity. In the following description, various aspects of the present disclosure are described with reference to the following drawings, in which:

FIG. 8 shows a flow chart illustrating a method for forming a semiconductor package according to an aspect of the present disclosure.

DETAILED DESCRIPTION

Figure 1A:
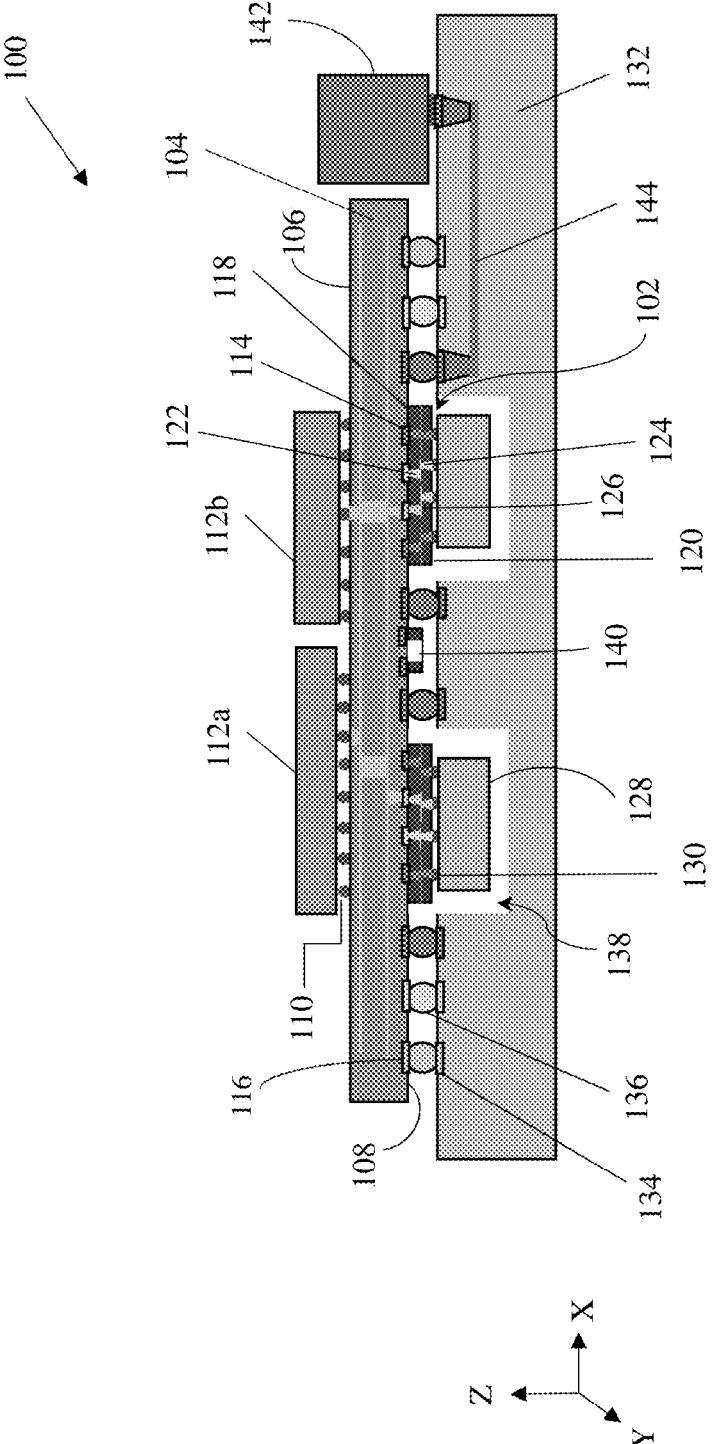
FIG. 1A shows a cross-sectional view of a semiconductor package according to an aspect of the present disclosure.

The following detailed description refers to the accompanying drawings that show, by way of illustration, specific details and aspects in which the present disclosure may be practiced. These aspects are described in sufficient detail to enable those skilled in the art to practice the present disclosure. Various aspects are provided for devices, and various aspects are provided for methods. It will be understood that the basic properties of the devices also hold for the methods and vice versa. Other aspects may be utilized and structural, and logical changes may be made without departing from the scope of the present disclosure. The various aspects are not necessarily mutually exclusive, as some aspects may be combined with one or more other aspects to form new aspects.

The present disclosure generally relates to a semiconductor package that may include a package substrate with a first surface and an opposing second surface, a first device coupled to the first surface of the package substrate, a redistribution frame coupled to the second surface of the package substrate, a plurality of solder balls coupled to the second surface of the package substrate, a second device coupled to the redistribution frame, and a printed circuit board coupled to the plurality of solder balls on the second surface of substrate, wherein the redistribution frame coupled with the second device and the plurality of solder balls are positioned between the package substrate and the printed circuit board.

In various aspects, the redistribution frame may include a plurality of first frame vias for coupling to the second surface of the package substrate.

In various aspects, the redistribution frame may further include a plurality of second frame vias for coupling to the second device.

In various aspects, the redistribution frame may further include one or more redistribution layers extending over the plurality of first and second frame vias.

In various aspects, the redistribution frame may further include an extended frame portion to form an extended redistribution frame.

In various aspect, the package substrate may include a first footprint and the extended frame portion may include a second footprint greater than the first footprint.

In various aspects, the package substrate may include a plurality of first contact pads to connect to the plurality of first frame vias.

In various aspects, the package substrate may further include a plurality of second contact pads, wherein each second contact pad has a diameter or dimension larger than that of each first contact pad.

In various aspects, the printed circuit board may include a recess for accommodating the second device.

In various aspects, the semiconductor package may further include a passive component coupled to the second surface of the package substrate, wherein the passive component may be arranged close to the extended redistribution frame and overlap with the extended redistribution frame at the extended frame portion.

In various aspects, the passive component may include a capacitor, a resistor, an inductor, or a transformer.

In various aspects, the second device may include a dynamic random-access memory (DRAM) semiconductive die or a dynamic random-access memory (DRAM) package, a semiconductive I/O tile (e.g., a serializer and deserializer (Serdes) tile), or a neural networking accelerator semiconductive die.

The present disclosure also generally relates to a computing device. The computing device may include a communication chip and a semiconductor package coupled to the communication chip. The semiconductor package may include a package substrate with a first surface and an opposing second surface, a first device coupled to the first surface of the package substrate, a redistribution frame coupled to the second surface of the package substrate, a plurality of solder balls coupled to the second surface of the package substrate, a second device coupled to the redistribution frame, and a printed circuit board coupled to the plurality of solder balls on the second surface of substrate, wherein the redistribution frame coupled with the second device and the plurality of solder balls are positioned between the package substrate and the printed circuit board.

The present disclosure further generally relates to a method, e.g., a method including providing a package substrate with a top surface and a bottom surface, coupling a first device to the top surface of the package substrate, providing a plurality of solder balls on the bottom surface of the package substrate, coupling a redistribution frame to the bottom surface of the substrate, coupling a second device to the redistribution frame, and coupling a printed circuit board to the plurality of solder balls on the bottom surface of the package substrate, wherein the redistribution frame coupled with the second device and the plurality of solder balls are positioned between the package substrate and the printed circuit board.

The present disclosure addresses the challenges of increased package form-factor (e.g., layer count and/or footprint) ascribed to memory bandwidth density scaling to achieve next-generation computing system requirements. The bandwidth of memory, e.g., dynamic random-access memory (DRAM) is defined as the product of the number of data bits in the memory bus and the speed of a single bit in the bus as expressed as Equation (1). With every advancement of memory technology, e.g., from LPDDR4 to LPDDR5, more package layer count and/or trace spacing are required to mitigate the electrical coupling noises, e.g., increased far-end crosstalk (FEXT) noise coupling across the transmission line due to increased bit data-rate or reduced signal rise time (Tr) as shown in Equation (2).

$$\text{Bandwidth}(BW) = \# \text{ of Bits} \times \text{Bit Rate} \qquad \text{Eq. (1)}$$

$$\text{Far End Crosstalk}(FEXT) = -\frac{(V \text{ input})(TD)}{2Tr}\left[\frac{L_M}{L} - \frac{C_M}{C}\right] \qquad \text{Eq. (2)}$$

The present disclosure also addresses the package and/or the platform design complexity to accommodate multiple memory channel and/or DRAM device configurations, e.g., ×8, ×16, ×32 or ×64 DRAM devices (×8/×16/×32/×64 refers to the number of data bits per DRAM).

The technical advantages of the present disclosure may include but not limited to:

Platform miniaturization through reduced platform core design footprint, e.g., real-estate required by compute die package, DRAM devices and/or voltage regulator (VR) components.

Improved electrical performance, e.g., reduced signal latency between CPU/GPU/SOC and DRAM memory devices through shorter interconnects and less distorted signal transmission path with the opossum redistribution frame and devices; direct top-to-bottom vertical interconnection minimizes lateral transmission path compared to placement of DRAM devices adjacent SOC/CPU/GPU dies on package top-side and/or conventional PCB routing.

Package layer count reduction may be achieved through the opossum redistribution frame, i.e., localized memory I/O routing and/or voltage reference planes e.g., power (Vcc) rails and/or ground (Vss) reference plane for improved current return path and electromagnetic shielding without mandating overall package stack-up or layer count configuration.

Improved package design flexibility for a memory controller, e.g., a computing die or a system-on-chip with various DRAM device configurations, e.g., memory channel count variability through the opossum redistribution frame; the opossum redistribution frame provides an interface to reconfigure the interconnection between the memory controller and the DRAM with scalable bandwidth density.

To more readily understand and put into practical effect the present disclosure, particular aspects will now be described by way of examples and not limitations, and with reference to the drawings. For the sake of brevity, duplicate descriptions of features and properties may be omitted.

FIG. 1A shows a cross-sectional view (i.e., in z-x axis) of a semiconductor package 100 according to an aspect of the present disclosure. In this illustration, it is shown the semiconductor package 100, e.g., a multichip package assembly, with a redistribution frame 102. The cross-section is taken along the A-A' line of FIG. 1B.

The term "multichip package" generally refers to a semiconductor package that may include two or more chips and/or chiplets that may be arranged laterally along the same plane. As different types of devices cater to different types of applications, more chiplets may be required in some systems to meet the requirements of high performance applications.

In FIG. 1A, the semiconductor package 100 may include a substrate 104 (i.e., a package substrate). The substrate 104 may have a first surface 106 and an opposing second surface 108. A plurality of solder bumps 110 may be disposed on the first surface 106 of the substrate 104. A first device, which is shown as a first silicon die 112*a* and a second silicon die 112*b* in FIG. 1A, may to be coupled to the first surface 106 via the plurality of solder bumps 110. The first and second silicon dies (112*a*, 112*b*), respectively, may be one of a central processing unit (CPU), a graphic processing unit (GPU), a system-on-chip (SOC), a field programmable gate array (FPGA), a platform controller hub (PCH chipset) and/or other processor device.

A plurality of first contact pads 114 and a plurality of second contact pads 116 may be disposed on the second surface 108 of the substrate 104. In one embodiment, the first and second contact pads (114, 116) may be circular in shape. In other embodiments, the first and second contact pads (114, 116) may be squarish, rectangular, or in other shapes. The diameter (or dimension) of each second contact pad 116 may be bigger than the diameter of each first contact pad 114. For example, the diameter of each first contact pad 114 may range from 80 μm to 250 μm while the diameter of each second contact pad 116 may range from 300 μm to 700 μm. The second contact pads 116 may be arranged such that they surround or encircle the first contact pads 114. In one embodiment, the spacing between two adjacent second contact pads 116 may be bigger than the spacing between two adjacent first contact pads 114. For example, the spacing between two adjacent first contact pads 114 may range from 20 μm to 50 μm while the spacing between two adjacent second contact pads 116 may range from 100 μm to 300 μm. The diameters and spacings of the contact pads may be sized according to their designated connections (i.e., the coupling to other devices, interconnect vias, etc.).

The semiconductor package 100 may further include a redistribution frame 102. In an aspect, the redistribution frame 102 may be an epoxy mold frame, for example, a composite of epoxy polymer resin and silica filler. In an aspect, the redistribution frame 102 may be a silicone mold frame. In another aspect, the redistribution frame 102 may be an elastomer mold frame. The redistribution frame 102 may have a first surface 118 and an opposing second surface 120. The first surface 118 and the second surface 120 may have the same surface area such that the redistribution frame 102 has a uniform cross-section (e.g., a square, rectangular or block). The redistribution frame 102 may be coupled to the substrate 104; for example, the first surface 118 of the redistribution frame 102 may contact the second surface 108 of the substrate 104.

The redistribution frame 102 may include a plurality of first frame vias 122 and a plurality of second frame vias 124 connected by one or more redistribution layers 126. The redistribution layer 126 may extend over the first and second frame vias (122, 124). The plurality of first frame vias 122 and the plurality of second frame vias 124 may include copper-plated vias, or solder-composites vias such as tin-silver composites vias, having a pitch geometry ranging from 100 μm to 300 μm. The plurality of first frame vias 122 may be located close to the first surface 118 of the redistribution frame 102. The plurality of second frame vias 124 may be located close to the second surface 120 of the redistribution frame 102. The redistribution layer 126 may include a plurality of metallization planes, which may be coupled to, for example, a ground reference voltage (Vss) or a power supply reference voltage (Vcc) (not shown).

The plurality of first frame vias 122 may be coupled to the plurality of first contact pads 114 such that the redistribution frame 102 may be electrically coupled to the substrate 104.

The semiconductor package 100 may further include a second device, i.e., an electronic component 128, coupled to the redistribution frame 102 on the second surface 120 through the plurality of second frame vias 124. The electronic component 128 may include a plurality of solder bumps 130 to provide an electrical connection between the electronic component 128 and the redistribution frame 102. In one aspect, the electronic component 128 may be a dynamic random-access memory (DRAM) semiconductive die. In another aspect, the electronic component 128 may be a semiconductive I/O tile e.g., a serializer and deserializer (Serdes) tile. In another aspect, the electronic component 128 may be a neural networking accelerator semiconductive die.

The semiconductor package 100 may be coupled to a printed circuit board 132. The printed circuit board 132 may include a plurality of contact pads 134 coupled to the plurality of second contact pads 116 of the substrate 104 through solder balls 136.

The printed circuit board 132 may further include a recess 138 for accommodating the electronic component 128. The electronic component 128 may be completely housed within the recess 138 of the printed circuit board 132, for example.

The semiconductor package 100 may further include one or more passive components 140. The passive component 140 may be coupled to the substrate 104 on its second surface 108. The passive component 140 may be arranged close to the redistribution frame 102. For example, the passive component 140 may include a capacitor, a resistor, an inductor, or a transformer. In one aspect, the passive component 140 may be decoupling capacitors, including multi-layer ceramic capacitors or silicon capacitors.

In the aspect shown in FIG. 1A, the semiconductor package 100 may include two identical redistribution frames 102, each redistribution frame 102 coupled to a respective electronic component 128, and the above discussion with respect to one redistribution frame may apply to the other redistribution frame.

The semiconductor package 100 may further include a voltage regulator 142. The voltage regulator 142 may be coupled to the printed circuit board 132. The voltage regulator 142 may be electrically coupled to the substrate 104 through the solder balls 136 and an interconnect 144 embedded in the printed circuit board 132.

The substrate 104 may have solder balls, contact pads, electrical interconnects and routings, and other features, which may or may not be shown in any of the present figures and which are conventional features known to a person skilled in the art. Various couplings of the components may use conventional methods, including solder bonding, thermal compression bonding, or other metal diffusion method.

Figure 1B:
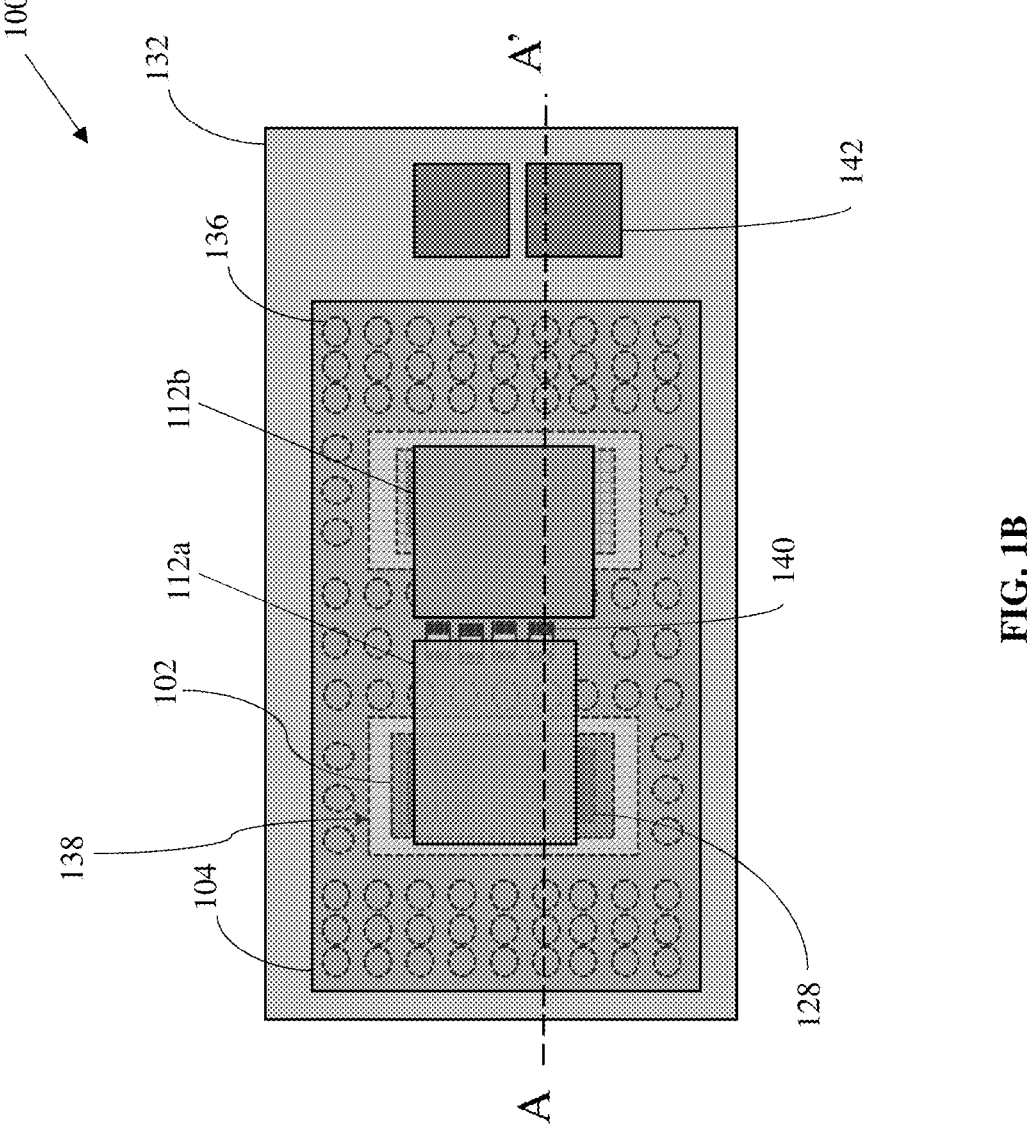
FIG. 1B shows a top view layout of the semiconductor package according to the aspect as shown in FIG. 1A.

FIG. 1B shows a top view (i.e., in y-x axis) layout of the semiconductor package 100 according to the aspect as shown in FIG. 1A.

The redistribution frame 102 may include a perimeter or footprint shown in a dashed line. The substrate 104 may include a perimeter or footprint. The silicon dies (112a, 112b) may each include a perimeter or footprint. The electronic component 128 may include a perimeter or footprint shown in a dashed line. The printed circuit board 132 may include a perimeter or footprint. The plurality of solder balls 136 may include a perimeter or footprint shown in dashed lines. The recess 138 may include a perimeter or footprint shown in a dashed line. The passive component 140 may include a perimeter or footprint, as shown in FIG. 1B, on the same plane as the solder balls. The voltage regulator 142 may include a perimeter or footprint.

The footprints of the redistribution frame 102, the substrate 104, the silicon dies (112a, 112b), the electronic component 128, the plurality of solder balls 136, the recess 138, the passive component 140, and the voltage regulator 142 may all fall within the footprint of the printed circuit board 132.

The footprints of the redistribution frame 102, the silicon dies (112a, 112b), the electronic component 128, the plurality of solder balls 136, the recess 138, and the passive component 140 may all fall within the footprint of the substrate 104.

The footprint of the electronic component 128 may fall within the footprint of the redistribution frame 102, and the footprints of the redistribution frame 102 and the electronic component 128 may fall within the footprints of the recess 138.

The passive component 140 may be arranged between two redistribution frames 102, and the redistribution frames 102 may be surrounded or encircled by the plurality of solder balls 136.

Figure 1C:
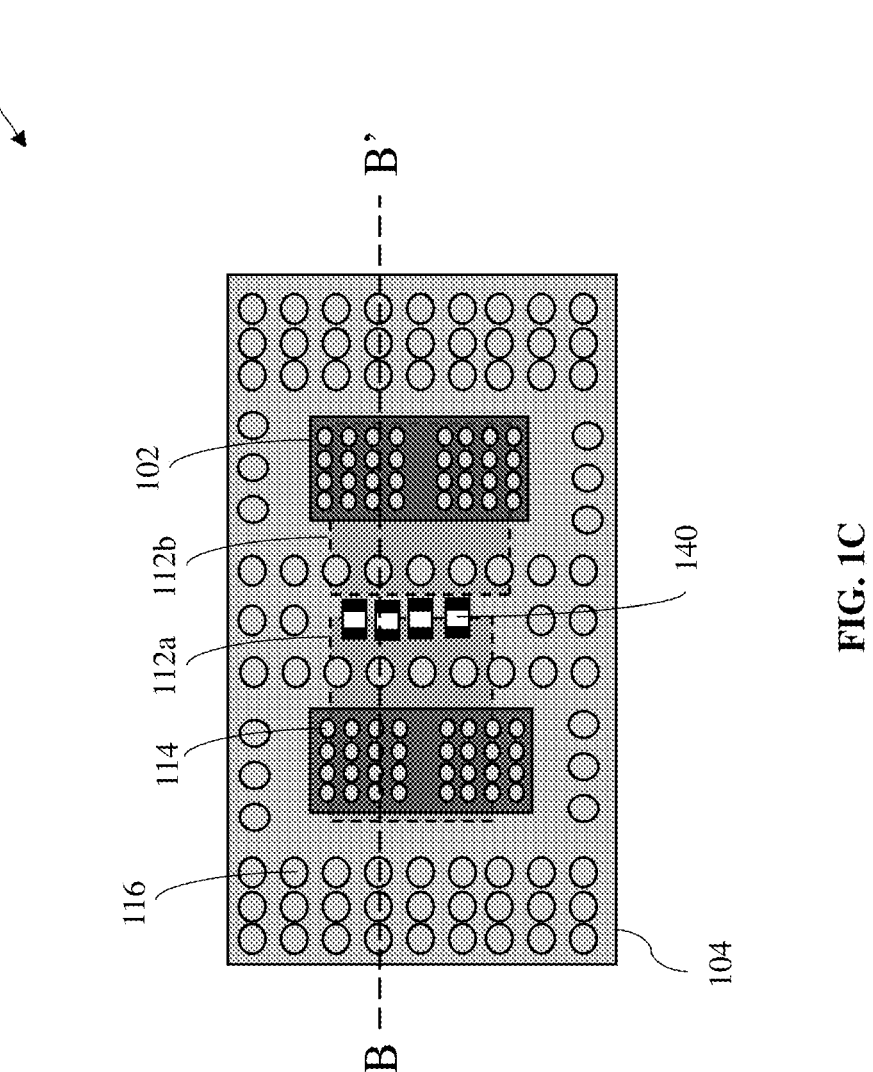
FIG. 1C shows a bottom view layout of a substrate of the semiconductor package according to the aspect as shown in FIG. 1A.
Figure 1C:
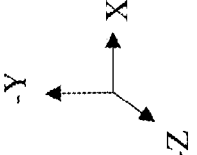

FIG. 1C shows a bottom view (i.e., in y-x axis) of the substrate 104 without the printed circuit board 132 and the electronic component 128 according to the aspect as shown in FIG. 1A.

The substrate 104 may include a perimeter or footprint. The redistribution frame 102 may include a perimeter or footprint, which may be generally rectangularly-shaped. It is within the scope of the present disclosure to have a redistribution frame with other shapes as dictated by space consideration. The silicon dies (112a, 112b) may each include a perimeter or footprint shown in a dashed line. The plurality of first contact pads 114 may include a perimeter or footprint. The plurality of second contact pads 116 may include a perimeter or footprint. The passive component 140 may include a perimeter or footprint.

The footprints of the redistribution frame 102, the silicon dies (112a, 112b), the plurality of first contact pads 114, the plurality of second contact pads 116, and the passive component 140 may all fall within the footprint of the substrate 104.

The footprint of the plurality of first contact pads 114 may fall within the footprint of the redistribution frame 102. The passive component 140 may be arranged between two redistribution frames 102, and the redistribution frames 102 may be surrounded or encircled by the plurality of second contact pads 116.

Figure 2A:
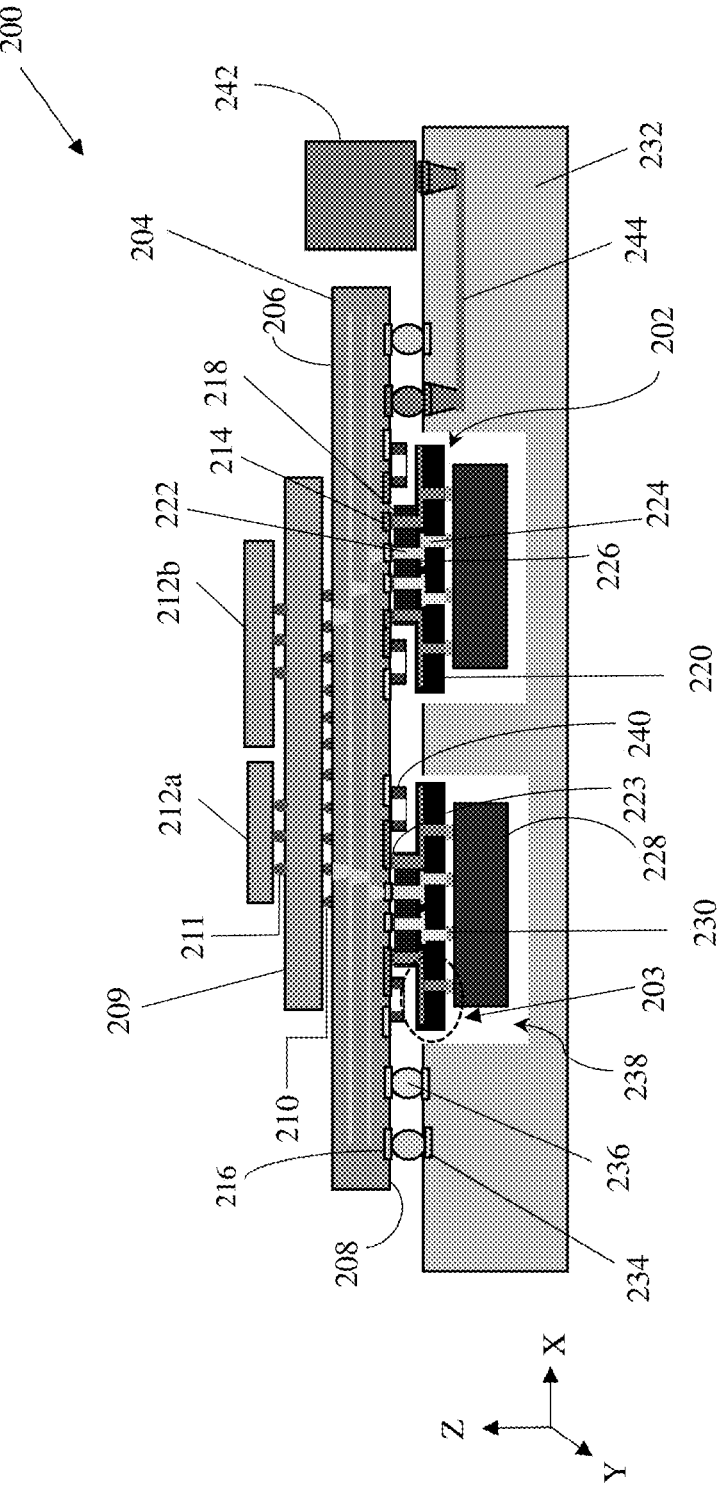
FIG. 2A shows a cross-sectional view of a semiconductor package according to another aspect of the present disclosure.

FIG. 2A shows a cross-sectional view (i.e., in z-x axis) of a semiconductor package 200 according to an aspect of the present disclosure. In this illustration, it is shown the semiconductor package 200, e.g., a multichip package assembly, with an extended redistribution frame 202 for improved memory device bandwidth density. The cross-section is taken along the A-A' line of FIG. 2B. The semiconductor package 200 may be similar to the semiconductor package 100 of FIG. 1A and may include additional variations and components as described below.

In FIG. 2A, the semiconductor package 200 may include a substrate 204. The substrate 204 may have a first surface 206 and an opposing second surface 208. A plurality of solder bumps 210 may be disposed on the first surface 206 of the substrate 204. An interposer 209 (e.g., a silicon interposer) may be coupled to the substrate 204 through the plurality of solder bumps 210. A first device, which is shown as a first chiplet 212a and a second chiplet 212b in FIG. 2A, may to be coupled to the silicon interposer 209 via a plurality of solder bumps 211. The first and second chiplets (212a, 212b), respectively, may be one of a central processing unit (CPU) chiplet, a graphic processing unit (GPU) chiplet, a memory controller chiplet, an I/O tile chiplet, or a field programmable gate array (FPGA) chiplet, and/or other processor device.

A plurality of first contact pads 214 and a plurality of second contact pads 216 may be disposed on the second surface 208 of the substrate 204. In one embodiment, the first and second contact pads (214, 216) may be circular in shape. In other embodiments, the first and second contact pads (214, 216) may be squarish, rectangular, or in other shapes. The diameter (or dimension) of each second contact pad 216 may be bigger than the diameter of each first contact pad 214. For example, the diameter of each first contact pad 214 may range from 80 µm to 250 µm while the diameter of each second contact pad 216 may range from 300 µm to 700 µm. The second contact pads 216 may be arranged such that they surround or encircle the first contact pads 214. In one embodiment, the spacing between two adjacent second contact pads 216 may be bigger than the spacing between two adjacent first contact pads 214. For example, the spacing between two adjacent first contact pads 214 may range from 20 µm to 50 µm while the spacing between two adjacent second contact pads 216 may range from 100 µm to 300 µm. The diameters and spacings of the contact pads may be sized according to their designated connections (i.e., the coupling to other devices, interconnect vias, etc.).

The semiconductor package 200 may further include an extended redistribution frame 202. In an aspect, the extended redistribution frame 202 may be an epoxy mold frame, for example, a composite of epoxy polymer resin and silica filler. In an aspect, the extended redistribution frame 202 may be a silicone mold frame. In another aspect, the extended redistribution frame 202 may be an elastomer mold frame. The two extended redistribution frames 202, as shown in FIG. 2A, may each have a first surface 218 and an opposing second surface 220. The second surface 220 has a larger surface area than that of the first surface 218 such that the cross-section of the extended redistribution frame 202 may be not uniform (e.g., an inverted T-shaped cross-section). In one aspect, the extended redistribution frame 202 may include an extended portion 203 (a portion encircled by a dashed line) that extends the second surface 220. The extended redistribution frame 202 may be coupled to the substrate 204, for example, the first surface 218 of the extended redistribution frame 202 may contact the second surface 208 of the substrate 204. In an aspect, the first surface 218 of the extended redistribution frame 202 may be reduced, as compared with the second surface 220 of the extended redistribution frame 202, to minimize its contact footprint with the second surface 208 of the substrate 204 for footprint miniaturization.

The extended redistribution frame 202 may include a plurality of first frame vias 222 and a plurality of second frame vias 224 connected by one or more redistribution layers 226. The redistribution layer 226 may extend over the first and second frame vias (222, 224). The plurality of first frame vias 222 and the plurality of second frame vias 224 may include copper-plated vias, or solder-composites vias such as tin-silver composites vias, having a pitch geometry ranging from 100 µm to 300 µm. The plurality of first frame vias 222 may be located close to the first surface 218 of the extended redistribution frame 202. The plurality of second frame vias 224 may be located close to the second surface 220 of the extended redistribution frame 202. The redistribution layer 226 may include a plurality of metallization planes, which may be coupled to, for example, a ground reference voltage (Vss) or a power supply reference voltage (Vcc) (not shown).

The plurality of first frame vias 222 may be coupled to the plurality of first contact pads 214, for example, through solder layer 223 such that the redistribution frame 202 may be electrically coupled to the substrate 204.

The semiconductor package 200 may further include a second device, i.e., an electronic component 228 coupled to the extended redistribution frame 202 on the second surface 220 through the plurality of second frame vias 224. The electronic component 228 may include a plurality of solder bumps 230 to provide an electrical connection between the electronic component 228 and the extended redistribution frame 202. In one aspect, the electronic component 228 may be a dynamic random-access memory (DRAM) package. In another aspect, the electronic component 228 may be a semiconductive I/O tile e.g., a serializer and deserializer (Serdes) tile. In another aspect, the electronic component 228 may be a neural networking accelerator semiconductive die.

The semiconductor package 200 may be coupled to a printed circuit board 232. The printed circuit board 232 may include a plurality of contact pads 234 coupled to the plurality of second contact pads 216 of the substrate 204 through solder balls 236 to facilitate signal transmission, power delivery, or voltage referencing.

The printed circuit board 232 may further include a recess 238 for accommodating or providing physical clearance for the electronic component 228 and/or extended redistribution frame 202. The electronic component 228 may be completely housed within the recess 238 of the printed circuit board 232, for example.

The semiconductor package 200 may further include one or more passive components 240. The passive component 240 may be coupled to the substrate 204 on its second surface 208. The passive component 240 may be arranged close to the extended redistribution frame 202 and overlap with the extended redistribution frame 202 at the extended portion 203, i.e., positioned in a space resulting from the reduced first surface 218 of the extended redistribution frame 202. For example, the passive component 240 may include a capacitor, a resistor, an inductor, or a transformer. In one aspect, the passive component 240 may be decoupling capacitors, including multi-layer ceramic capacitors or silicon capacitors. The passive component 240 may be electrically coupled to the first and second chiplets (212a, 212b), and the electronic component 228 to facilitate power delivery.

In the aspect shown in FIG. 2A, the semiconductor package 200 may include two identical extended redistribution frames 202, each extended redistribution frame 202 coupled to a respective electronic component 228 at the extended portion 203 of the extended redistribution frame 202, and the above discussion with respect to one extended redistribution frame may apply to the other extended redistribution frame.

The semiconductor package 200 may further include a voltage regulator 242. The voltage regulator 242 may be coupled to the printed circuit board 232. The voltage regulator 242 may be electrically coupled to the substrate 204 through the solder balls 236 and an interconnect 244 embedded in the printed circuit board 232.

The substrate 204 may have solder balls, contact pads, electrical interconnects and routings, and other features, which may or may not be shown in any of the present figures and which are conventional features known to a person skilled in the art. Various couplings of the components may use conventional methods, including solder bonding, thermal compression bonding, or other metal diffusion method.

Figure 2B:
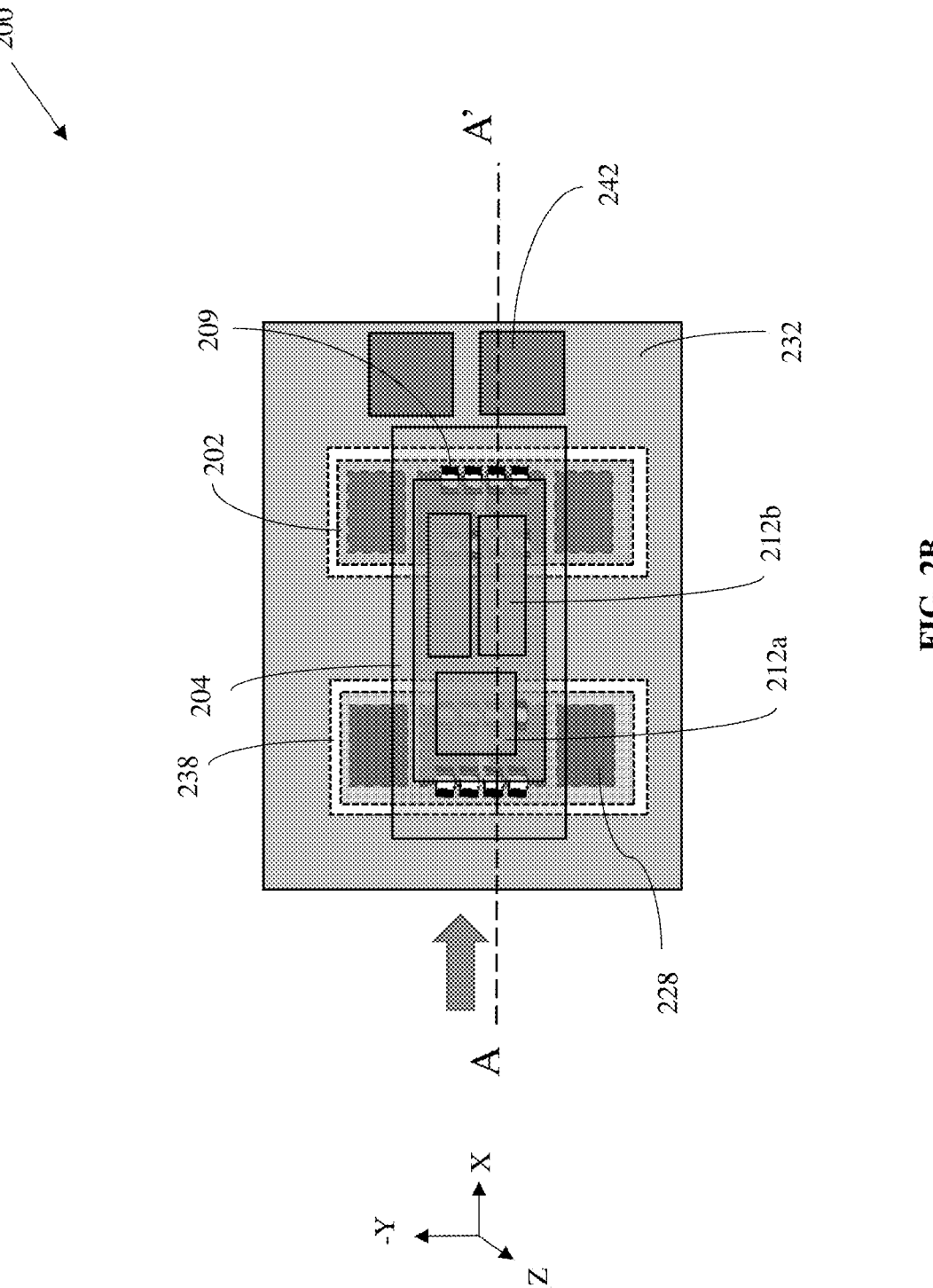
FIG. 2B shows a top view layout of the semiconductor package according to the aspect as shown in FIG. 2A.

FIG. 2B shows a top view (i.e., in y-x axis) layout of the semiconductor package 200 according to the aspect as shown in FIG. 2A.

The extended redistribution frame 202 may include a perimeter or footprint shown in a dashed line. The substrate 204 may include a perimeter or footprint. The interposer 209 may include a perimeter or footprint. The chiplets (212a, 212b) may each include a perimeter or footprint. The electronic component 228 may include a perimeter or footprint shown in a dashed line. The printed circuit board 232 may include a perimeter or footprint. The recess 238 may include a perimeter or footprint shown in a dashed line. The voltage regulator 242 may include a perimeter or footprint.

The footprints of the extended redistribution frame 202, the substrate 204, the interposer 209, the chiplets (212a, 212b), the electronic component 228, the recess 238, and the voltage regulator 242 may all fall within the footprint of the printed circuit board 232.

The footprint of the electronic component 228 may fall within the footprint of the extended redistribution frame 202, and the footprints of the extended redistribution frames 202 and the electronic component 228 may fall within the footprints of the recess 238. In an aspect, the footprint of the extended redistribution frame 202 may extend beyond the footprint of the substrate 204 to accommodate a plurality of electronic components 228 for improved performance.

Figure 2C:
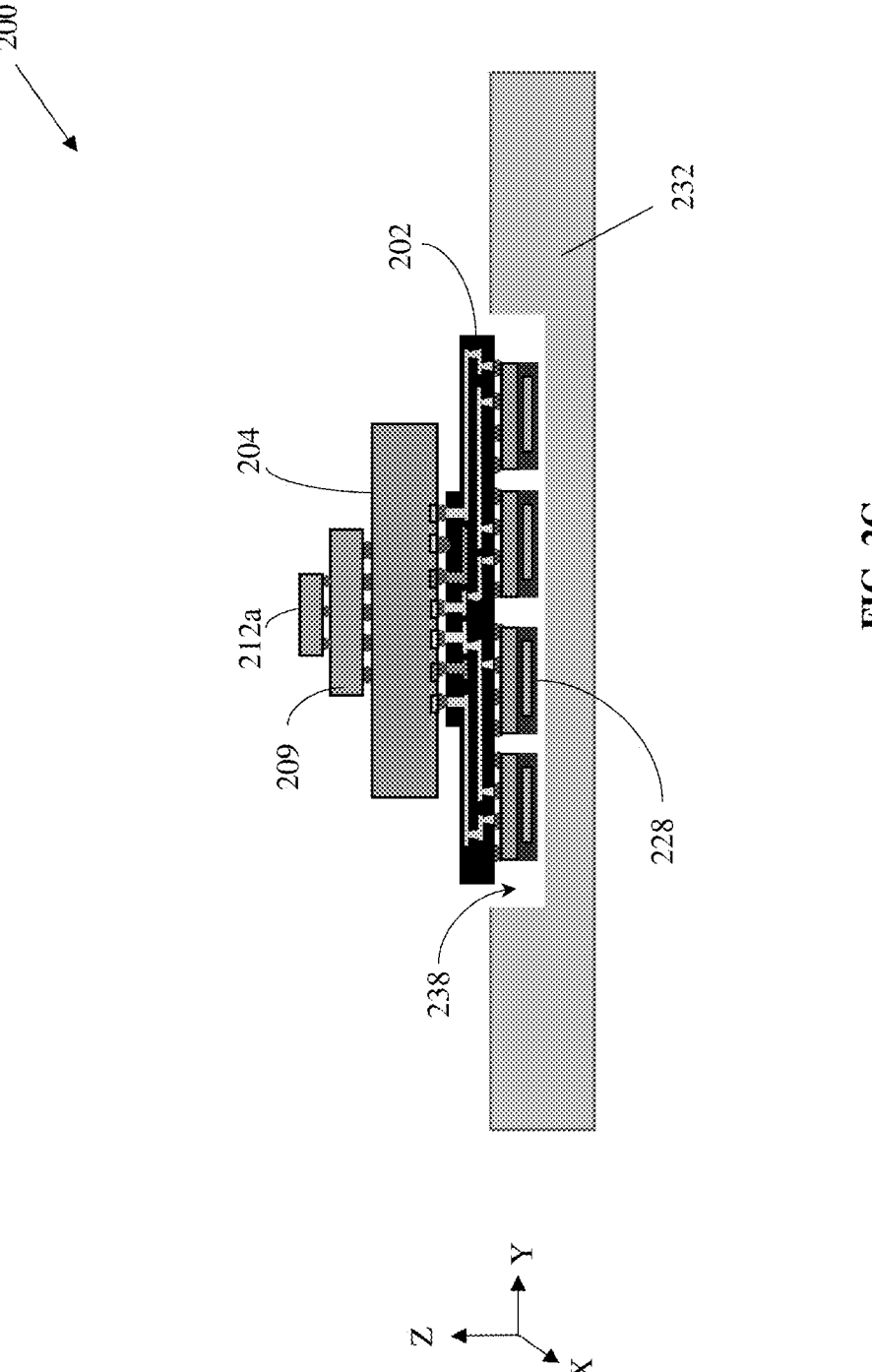
FIG. 2C shows a side view of the semiconductor package when viewed from "A" according to the aspect as shown in FIG. 2B.

FIG. 2C shows a side view of the semiconductor package 200 when viewed from "A" according to the aspect as shown in FIG. 2B.

The chiplet 212a, the interposer 209, the substrate 204, the extended redistribution frame 202, the electronic components 228, and the printed circuit board 232 may be arranged in a stacked configuration as described in FIG. 2A and FIG. 2B, whereby the electronic components 228 may be completed accommodated within the recess 238 of the printed circuit board 232.

As illustrated in FIG. 2C, the chiplet 212a and the electronic components 228 may be electrically coupled to the substrate 204 on opposing surfaces. The electronic components 228 may be electrically coupled to the substrate by means of the extended redistribution frame 202. As such, the extended redistribution frame 202 may be termed as an opossum extended redistribution frame.

Figure 3:
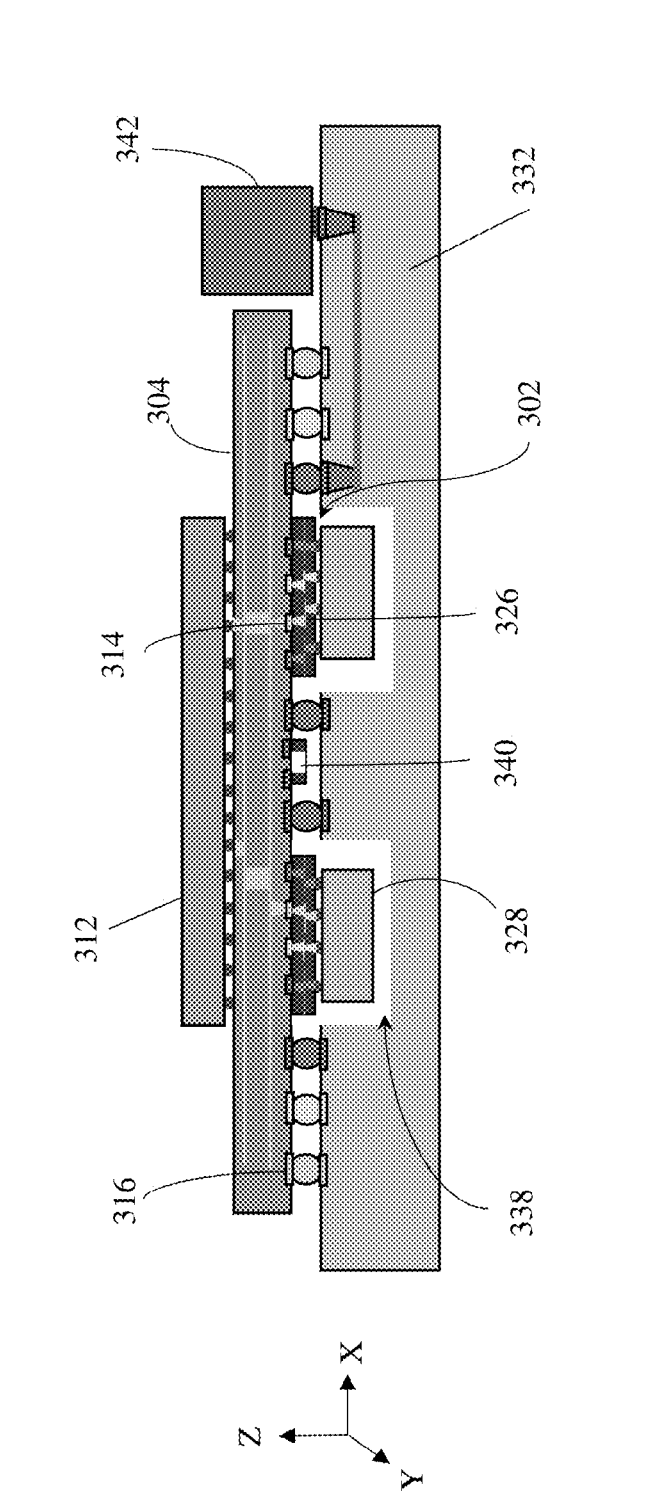
FIG. 3 shows a cross-sectional view of a semiconductor package according to an aspect of the present disclosure.

FIG. 3 shows a cross-sectional view (i.e., in z-x axis) of a semiconductor package according to an aspect of the present disclosure. In this illustration, the semiconductor package 300 is similar to the semiconductor package 100 of FIG. 1A, except that in place of the first and second silicon dies (112a, 112b), a single silicon die 312 may be coupled to a substrate 304 of the semiconductor package 300.

For the sake of brevity and conciseness, the configurations of the semiconductor package 300 including the silicon die 312, the substrate 304, the redistribution frame 302, the plurality of first contact pads 314, the redistribution layer 326, the electronic component 328, the printed circuit board 332, the recess 338, the passive component 340, and the voltage regulator 342 are already discussed in detail with reference to FIG. 1A and are therefore, not repeated herein.

Figure 4:
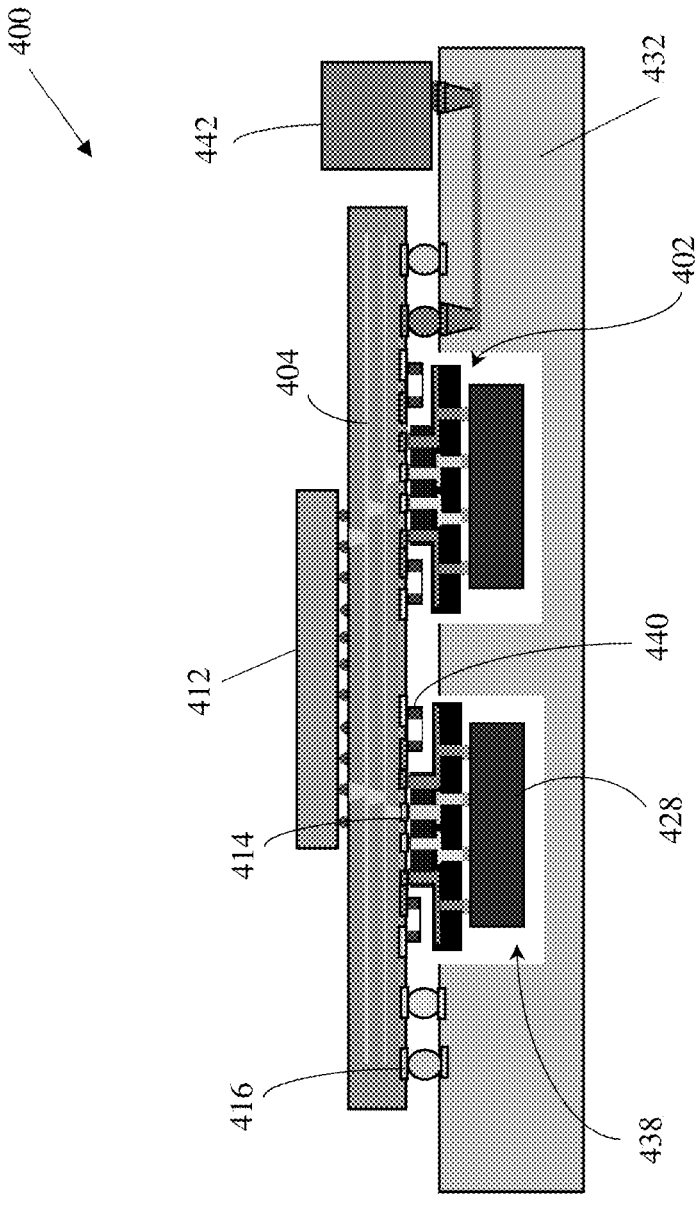
FIG. 4 shows a cross-sectional view of a semiconductor package according to an aspect of the present disclosure.
Figure 4:
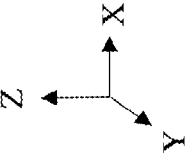

FIG. 4 shows a cross-sectional view (i.e., in z-x axis) of a semiconductor package according to an aspect of the present disclosure. In this illustration, the semiconductor package 400 is similar to the semiconductor package 200 of FIG. 2A, except that in place of the first and second chiplets (212a, 212b), a single silicon die 412 may be coupled to a substrate 404 of the semiconductor package 400, and the electronic component 428 may be a dynamic random-access memory (DRAM) package or a DRAM semiconductive die, a semiconductive I/O tile (e.g., a serializer and deserializer (Serdes) tile), or a neural networking accelerator semiconductive die.

For the sake of brevity and conciseness, the configurations of the semiconductor package 400 including the silicon die 412, the substrate 404, the extended redistribution frame 402, the plurality of first contact pads 414, the plurality of second contact pads 416, the printed circuit board 432, the recess 438, the passive component 440, and the voltage regulator 442 are already discussed in detail with reference to FIG. 2A and are therefore, not repeated herein.

While the above illustrated semiconductor packages may include either redistribution frames or extended redistribution frames, it is to be understood and appreciated that presently disclosed semiconductor package may also include a mixture of redistribution frames and extended redistribution frames.

FIGS. 5A through 5G show cross-sectional views directed to an exemplary simplified process flow for forming a semiconductor package 500, according to an aspect that is generally similar to that shown in FIG. 1A or FIG. 3 of the present disclosure. The order of assembly process operation may be interchangeable.

Figures 5A, 5B, 5C:
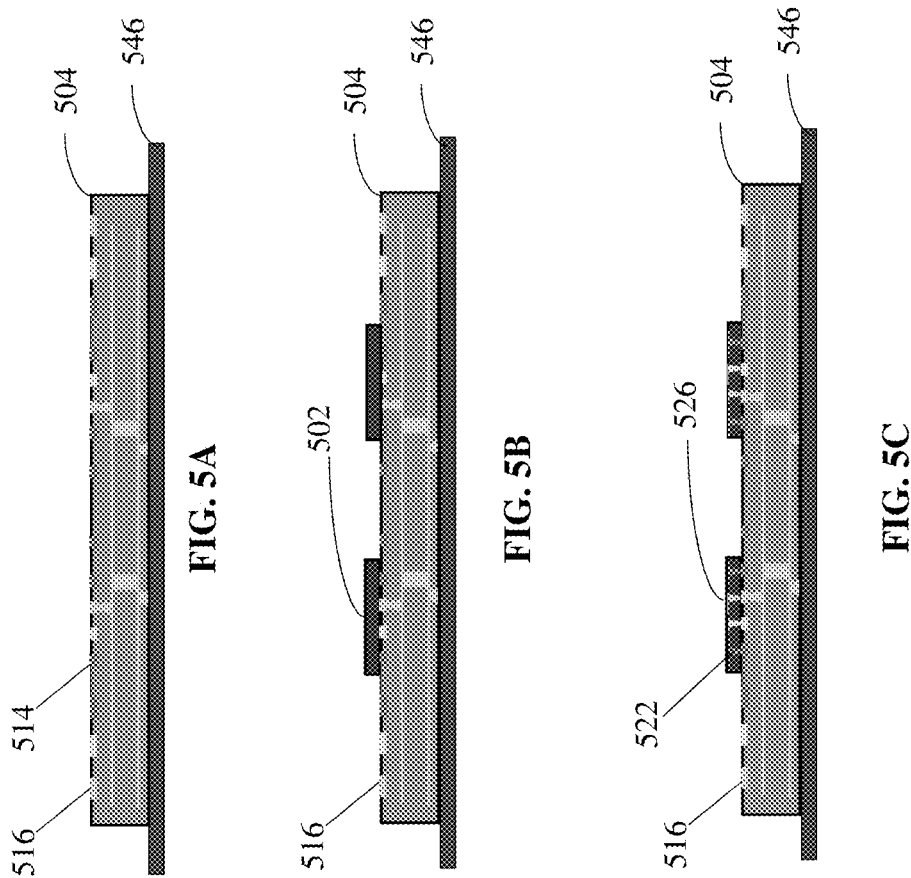
FIGS. 5A through 5G show cross-sectional views directed to an exemplary simplified process flow for forming a semiconductor package according to an aspect that is generally similar to that shown in FIG. 1A or FIG. 3 of the present disclosure.

FIG. 5A shows formation of a substrate 504 build-up. The substrate 504 may be deposited or laminated onto a carrier 546. The substrate 504 may already include a plurality of interconnects embedded therein. A plurality of first contact pads 514 and a plurality of second contact pads 516 may be disposed on the substrate 504. Conventional techniques may be employed, such as but not limited to, photolithography, etching, and plating process.

FIG. 5B shows formation of a redistribution frame 502. A partial redistribution frame 502 may be formed on the substrate 504 via a compression/injection/transfer molding process.

FIG. 5C shows formation of first frame vias 522 in the redistribution frame 502 by a laser drilling process, for example, followed by an electroplating or etching process. A first redistribution layer 526 may be formed by an electroplating process.

Figures 5D, 5E, 5F:
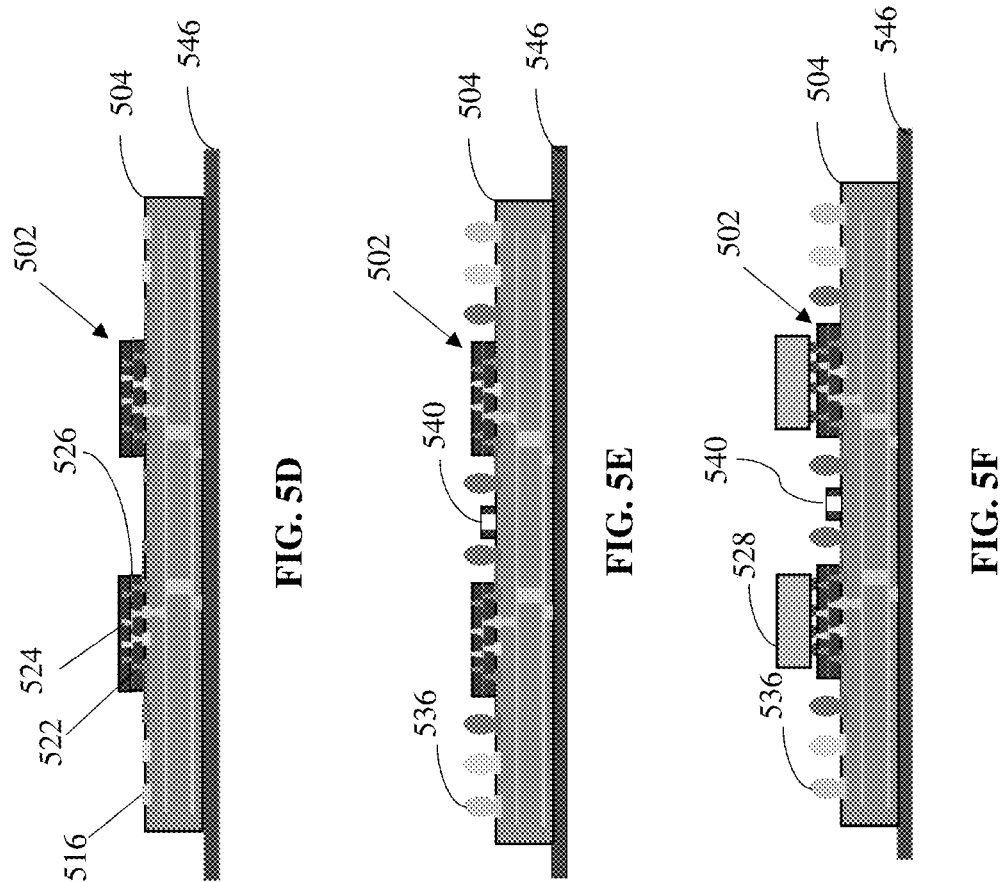

Second frame vias 524 may be further formed as shown in FIG. 5D, thereby forming the complete redistribution frame 502. Similar techniques such as laser drilling, electroplating/etching processes may be employed. In an aspect, a second redistribution layer (not shown) may be formed in between the second frame vias 524 and the first redistribution layer 526 using similar techniques such as laser drilling, electroplating/etching processes.

FIG. 5E shows attachment of discrete passive component 540 and solder balls 536 onto the substrate 504 by conventional techniques such as surface mounting and reflow processes, respectively.

FIG. 5F shows attachment of an electronic component 528 and solder bumps on the redistribution frame 502 by thermal compression bonding and reflow processes, respectively.

Figure 5G:
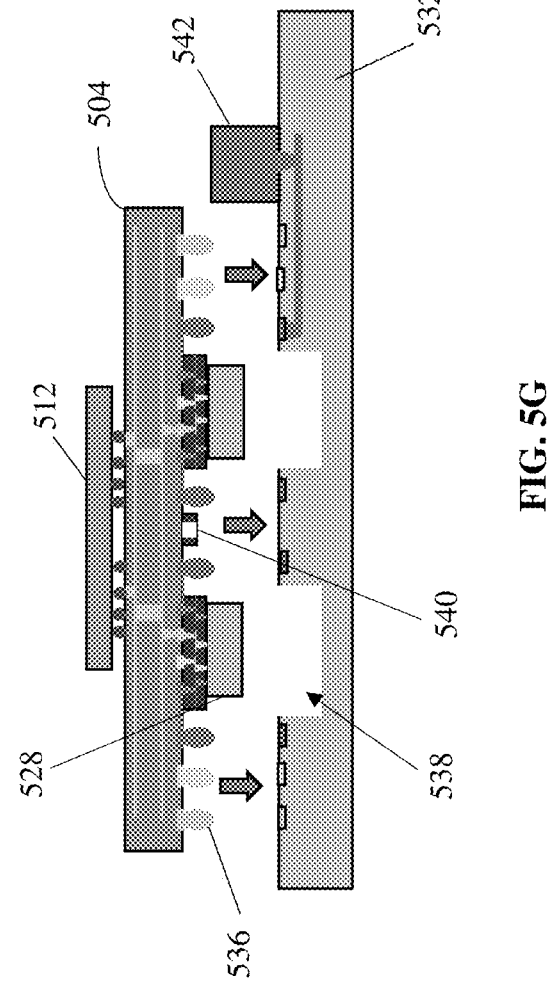

FIG. 5G shows attachment of the substrate 504 including a silicon die 512, the redistribution frame 502, the electronic component 528, and the passive component 540 to a printed circuit board 532. The carrier 546 may be delaminated from the substrate. The silicon die 512 may be coupled to the substrate via solder bumps. The substrate 504 may then be flipped over for coupling to the printed circuit board 532 via reflowing of the solder balls 536. The printed circuit board 532 may include contact pads disposed thereon, a recess 538, and a voltage regulator 542 coupled thereto.

FIGS. 6A through 6H show cross-sectional views directed to an exemplary simplified process flow for forming a semiconductor package 600, according to an aspect that is generally similar to that shown in FIG. 2A or FIG. 4 of the present disclosure. For brevity, attachment of a printed circuit board is omitted. The order of assembly process operation may be interchangeable.

Figures 6A, 6B, 6C, 6D:
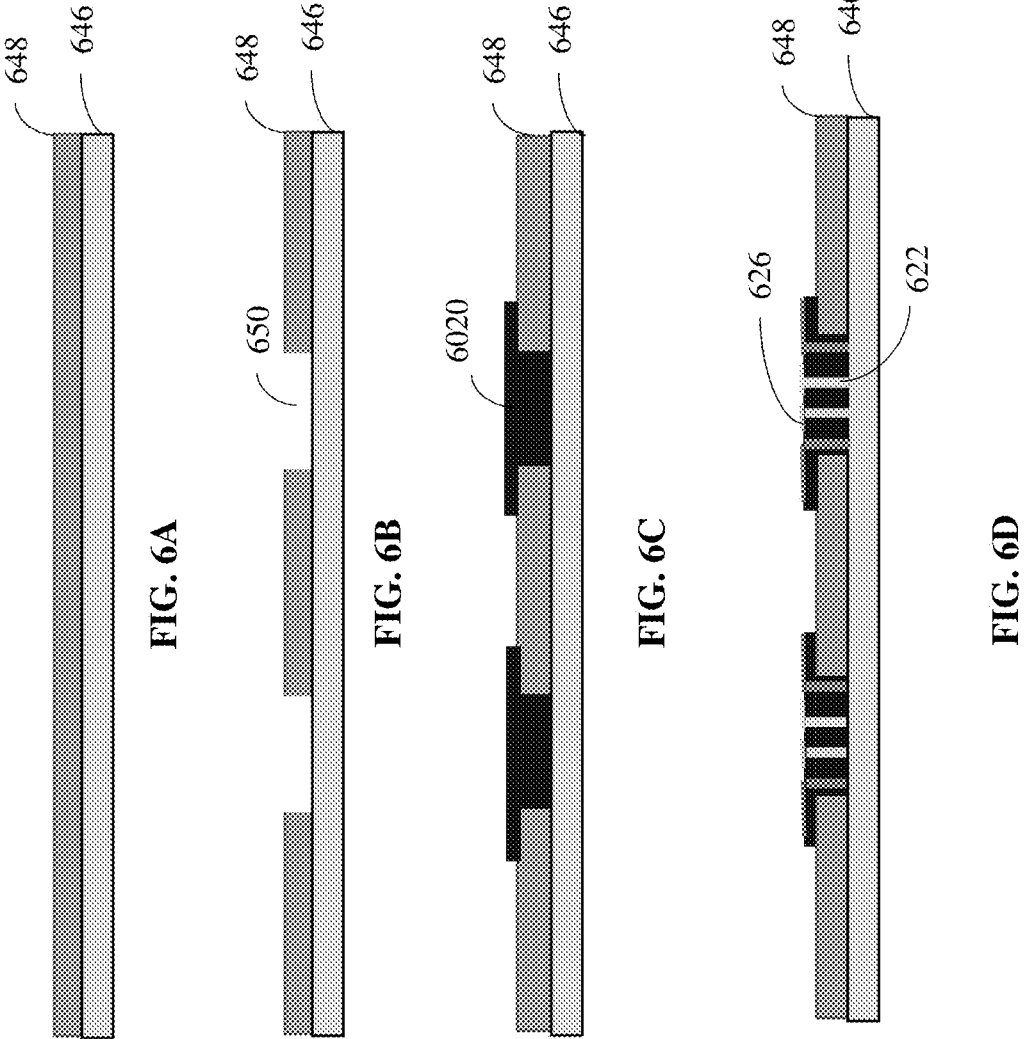
FIGS. 6A through 6H show cross-sectional views directed to an exemplary simplified process flow for forming a semiconductor package according to an aspect that is generally similar to that shown in FIG. 2A or FIG. 4 of the present disclosure.

FIG. 6A shows formation of a dry film resist (DFR) layer 648 on a carrier 646 by a hot-press lamination/coating/ spraying process, for example.

A portion of the DFR layer 648 may be removed to form a cavity 650 by conventional techniques such as a photolithography/chemical etching process, as shown in FIG. 6B.

FIG. 6C shows formation of a mold layer 6020 on the DFR layer 648 in the cavity 650 by processes such as compression/injection/transfer molding.

FIG. 6D shows formation of first frame vias 622 and a first redistribution layer 626. Convention techniques such as laser/mechanical drilling, plating/etching processes may be employed.

Figures 6E, 6F:
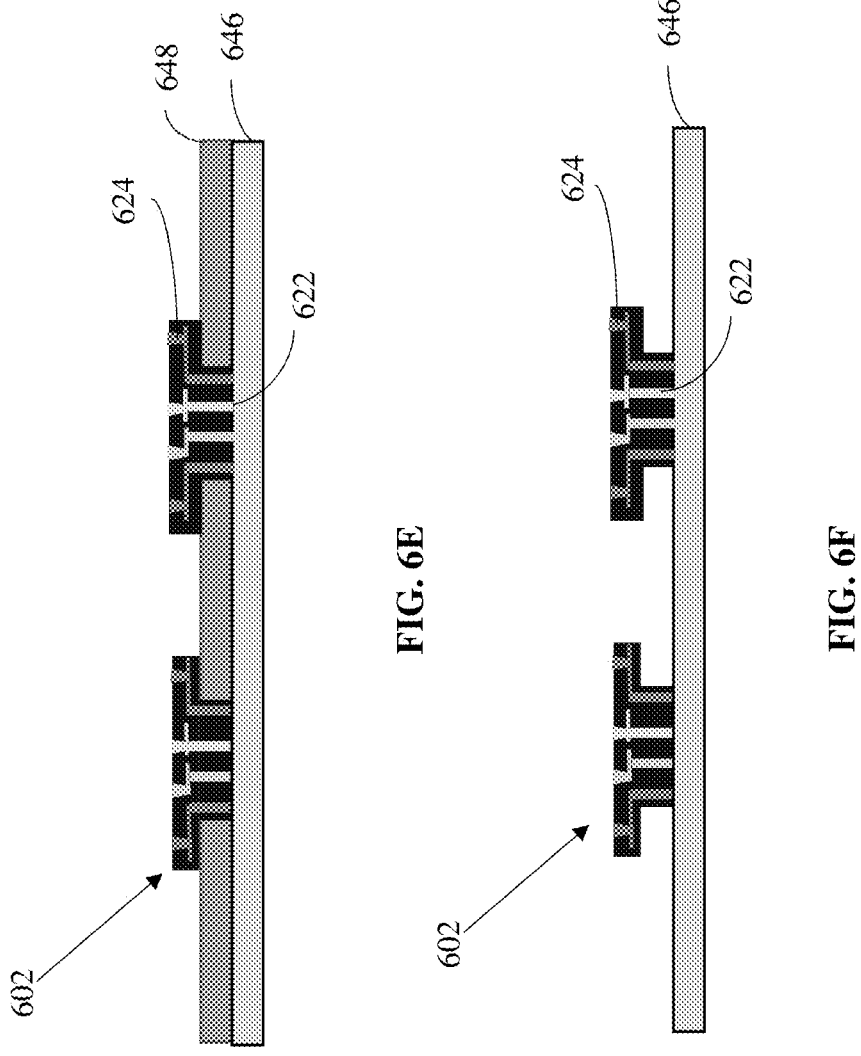

FIG. 6E shows formation of second frame vias 624 over the first frame vias 622 and the first redistribution layer 626 to form a complete extended redistribution frame 602. Similarly, convention techniques such as laser/mechanical drilling, plating/etching processes may be employed. In an aspect, a second redistribution layer (not shown) may be formed in between the second frame vias 624 and the first redistribution layer 626 using similar techniques such as laser drilling, electroplating/etching processes.

FIG. 6F shows removal of the DFR layer 648 by a chemical etching process, for example.

Figures 6G, 6H:
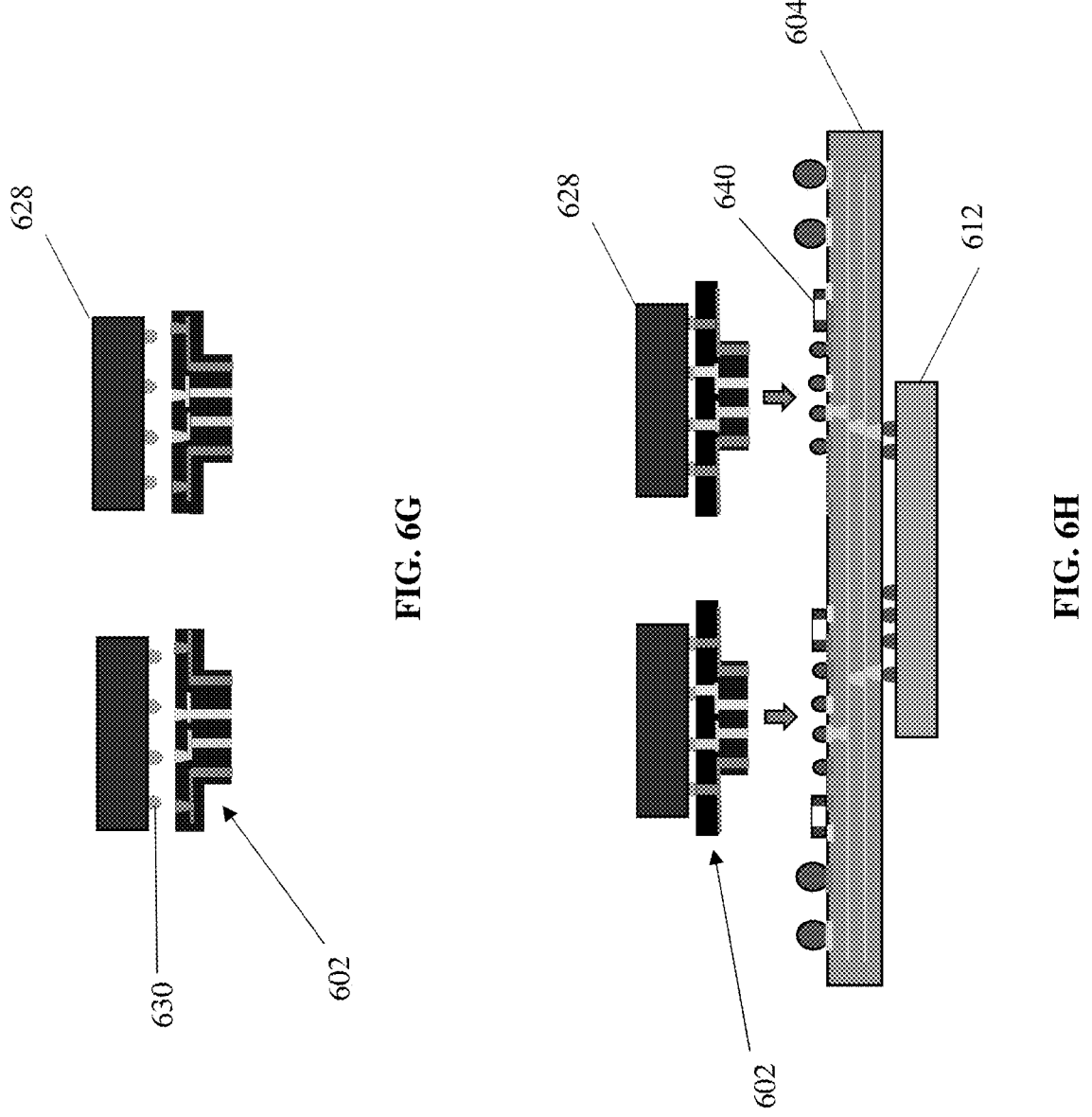

FIG. 6G shows attachment of an electronic component 628 on the extended redistribution frame 602. The electronic component 628 may include solder balls 630 for connection to the extended redistribution frame 602, for example, by a reflow/thermal compression bonding process.

FIG. 6H shows attachment of the extended redistribution frame 602 including the electronic component 628 on a substrate 604. The substrate 604 may include a silicon die 612 and a passive component 640 coupled to opposing surfaces of the substrate 604. The extended redistribution frame 602 may be coupled via thermal compression bonding/solder reflow processes to the substrate 604.

Figure 7:
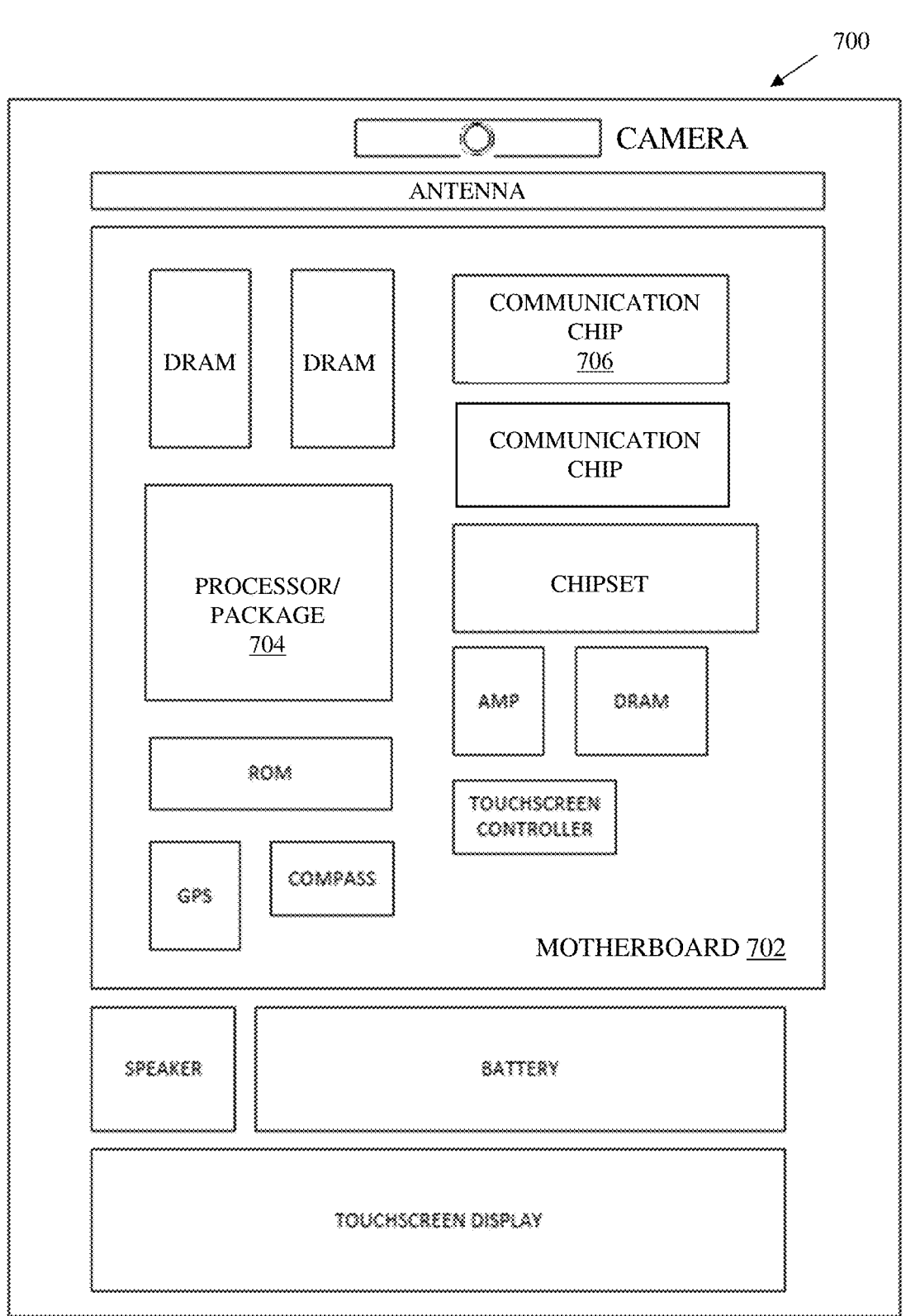
FIG. 7 shows an illustration of a computing device that includes a semiconductor package according to a further aspect of the present disclosure.

Aspects of the present disclosure may be implemented into a system using any suitable hardware and/or software. FIG. 7 schematically illustrates a computing device 700 that may include a semiconductor package as described herein, in accordance with some aspects. The computing device 700 may house a board such as a motherboard 702. The motherboard 702 may include a number of components, including but not limited to a processor 704 and at least one communication chip 706. The processor 704, which may have a semiconductor package according to the present disclosure, may be physically and electrically coupled to the motherboard 702. In some implementations, the at least one communication chip 706 may also be physically and electrically coupled to the motherboard 702. In further implementations, the communication chip 706 may be part of the processor or package 704.

Depending on its applications, computing device 700 may include other components that may or may not be physically and electrically coupled to the motherboard 702. These other components may include, but are not limited to, volatile memory (e.g. DRAM), non-volatile memory (e.g. ROM), flash memory, a graphics processor, a digital signal processor, a cryptoprocessor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

The communication chip 706 may enable wireless communications for the transfer of data to and from the computing device 700. The term "wireless" and its derivatives may be used to describe circuits, devices, systems, methods, techniques, communications channels, etc. that may communicate data through the use of modulated electromagnetic radiation through a non-solid medium. The term does not imply that the associated devices do not contain any wires, although in some aspects they might not. The communication chip 706 may implement any of a number of wireless standards or protocols, including but not limited to Institute for Electrical and Electronic Engineers (IEEE) standards including Wi-Fi (IEEE 502.11 family), IEEE 502.16 standards (e.g., IEEE 502.16-2005 Amendment), Long-Term Evolution (LTE) project along with any amendments, updates, and/or revisions (e.g., advanced LTE project, ultra-mobile broadband (UMB) project (also referred to as "3GPP2"), etc.). IEEE 502.16 compatible BWA networks are generally referred to as WiMAX networks, an acronym that stands for Worldwide Interoperability for Microwave Access, which is a certification mark for products that pass conformity and interoperability tests for the IEEE 502.16 standards.

The communication chip 706 may also operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 706 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 706 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 706 may operate in accordance with other wireless protocols in other aspects.

The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

In various implementations, the computing device 700 may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In an aspect, the computing device 700 may be a mobile computing device. In further implementations, the computing device 700 may be any other electronic device that processes data.

FIG. 8 shows a flow chart illustrating a method 800 of forming a semiconductor package according to an aspect of the present disclosure.

As shown in FIG. 8, at operation 802, the method 800 of forming a semiconductor package may include forming a redistribution frame including a plurality of first frame vias and a plurality of second frame vias connected by one or more redistribution layers.

At operation 804, the method may include providing a package substrate.

At operation 806, the method may include providing a first electronic component.

At operation 808, the method may include coupling the package substrate to the redistribution frame on a first surface through the plurality of first frame vias.

At operation 810, the method may include coupling the first electronic component to the redistribution frame on a second surface opposing the first surface through the plurality of second frame vias.

It will be understood that the above operations described above relating to FIG. 8 are not limited to this particular order. Any suitable, modified order of operations may be used.

EXAMPLES

Example 1 may include a semiconductor package including a package substrate with a first surface and an opposing second surface, a first device coupled to the first surface of the package substrate, a redistribution frame coupled to the second surface of the package substrate, a plurality of solder balls coupled to the second surface of the package substrate, a second device coupled to the redistribution frame, and a printed circuit board coupled to the plurality of solder balls on the second surface of substrate, wherein the redistribution frame coupled with the second device and the plurality of solder balls may be positioned between the package substrate and the printed circuit board.

Example 2 may include the semiconductor package of example 1 and/or any other example disclosed herein, wherein the redistribution frame may include a plurality of first frame vias for coupling to the second surface of the package substrate.

Example 3 may include the semiconductor package of example 2 and/or any other example disclosed herein, wherein the redistribution frame may further include a plurality of second frame vias for coupling to the second device.

Example 4 may include the semiconductor package of example 3 and/or any other example disclosed herein, wherein the redistribution frame may further include one or more redistribution layers extending over the plurality of first and second frame vias.

Example 5 may include the semiconductor package of example 1 and/or any other example disclosed herein, wherein the redistribution frame may further include an extended frame portion to form an extended redistribution frame.

Example 6 may include the semiconductor package of example 5 and/or any other example disclosed herein, wherein the package substrate may include a first footprint and the extended frame portion may include a second footprint greater than the first footprint.

Example 7 may include the semiconductor package of example 1 and/or any other example disclosed herein, wherein the package substrate may include a plurality of first contact pads to connect to the plurality of first frame vias.

Example 8 may include the semiconductor package of example 7 and/or any other example disclosed herein, wherein the package substrate may further include a plurality of second contact pads, wherein each second contact pad may have a diameter or dimension larger than that of each first contact pad.

Example 9 may include the semiconductor package of example 1 and/or any other example disclosed herein, wherein the printed circuit board may include a recess for accommodating the second device.

Example 10 may include the semiconductor package of example 5 and/or any other example disclosed herein, further including a passive component coupled to the second surface of the package substrate, wherein the passive component may be arranged close to the extended redistribution frame and may overlap with the extended redistribution frame at the extended frame portion.

Example 11 may include the semiconductor package of example 10 and/or any other example disclosed herein, wherein the passive component may include a capacitor, a resistor, an inductor, or a transformer.

Example 12 may include the semiconductor package of example 1 and/or any other example disclosed herein, wherein the second device may include a dynamic random-access memory (DRAM) semiconductive die or a dynamic random-access memory (DRAM) package, a semiconductive I/O tile, or a neural networking accelerator semiconductive die.

Example 13 may include a computing device including a communication chip and a semiconductor package coupled to the communication chip, the semiconductor package may include a package substrate with a first surface and an opposing second surface, a first device coupled to the first surface of the package substrate, a redistribution frame coupled to the second surface of the package substrate, a plurality of solder balls coupled to the second surface of the package substrate, a second device coupled to the redistribution frame, and a printed circuit board coupled to the plurality of solder balls on the second surface of substrate, wherein the redistribution frame coupled with the second device and the plurality of solder balls may be positioned between the package substrate and the printed circuit board.

Example 14 may include the computing device of example 13 and/or any other example disclosed herein, wherein the redistribution frame may further include an extended frame portion.

Example 15 may include the computing device of example 13 and/or any other example disclosed herein, wherein the printed circuit board may include a recess for accommodating the second device.

Example 16 may include the computing device of example 13 and/or any other example disclosed herein, wherein the second device may include a dynamic random-access memory (DRAM) semiconductive die or a dynamic random-access memory (DRAM) package, a semiconductive I/O tile, or a neural networking accelerator semiconductive die.

Example 17 may include a method including providing a package substrate with a top surface and a bottom surface, coupling a first device to the top surface of the package substrate, providing a plurality of solder balls on the bottom surface of the package substrate, coupling a redistribution frame to the bottom surface of the substrate, coupling a second device to the redistribution frame, and coupling a printed circuit board to the plurality of solder balls on the bottom surface of the package substrate, wherein the redistribution frame coupled with the second device and the plurality of solder balls may be positioned between the package substrate and the printed circuit board.

Example 18 may include the method of example 17 and/or any other example disclosed herein, wherein the redistribution frame may further include a plurality of first and second frame vias, and one or more redistribution layers extending over the plurality of first and second frame vias.

Example 19 may include the method of example 17 and/or any other example disclosed herein, further including forming an extended frame portion on the redistribution frame.

Example 20 may include the method of example 17 and/or any other example disclosed herein, further including forming a recess in the printed circuit board for accommodating the second device.

The term "comprising" shall be understood to have a broad meaning similar to the term "including" and will be understood to imply the inclusion of a stated integer or operation or group of integers or operations but not the exclusion of any other integer or operation or group of integers or operations. This definition also applies to variations on the term "comprising" such as "comprise" and "comprises".

The term "coupled" (or "connected") used herein may be understood as electrically coupled or as mechanically coupled, e.g. attached or fixed or mounted, or just in contact without any fixation, and it will be understood that both direct coupling and indirect coupling (in other words, coupling without direct contact) may be provided.

While the present disclosure has been particularly shown and described with reference to specific aspects, it should be understood by persons skilled in the art that various changes in form and detail may be made therein without departing from the scope of the present disclosure as defined by the appended claims. The scope of the present disclosure is thus indicated by the appended claims and all changes which come within the meaning and range of equivalency of the claims are therefore intended to be embraced.

What is claimed is:

1. A semiconductor package comprising:
a package substrate with a first surface and an opposing second surface;
a first device coupled to the first surface of the package substrate;
a redistribution frame coupled to the second surface of the package substrate;
a plurality of solder balls coupled to the second surface of the package substrate;
a second device coupled to the redistribution frame; and
a printed circuit board coupled to the plurality of solder balls on the second surface of the package substrate, wherein the redistribution frame and the plurality of solder balls are positioned between the package substrate and the printed circuit board, wherein the redistribution frame comprises a plurality of first frame vias, wherein the plurality of first frame vias directly couple the redistribution frame to the second surface of the package substrate.

2. The semiconductor package of claim 1, wherein the redistribution frame further comprises a plurality of second frame vias, wherein the plurality of second frame vias directly couple the redistribution frame to the second device.

3. The semiconductor package of claim 2, wherein the redistribution frame further comprises one or more redistribution layers extending over the plurality of first and second frame vias.

4. The semiconductor package of claim 1, wherein the redistribution frame further comprises an extended frame portion to form an extended redistribution frame.

5. The semiconductor package of claim 4, wherein the package substrate comprises a first footprint and the extended frame portion comprises a second footprint greater than the first footprint.

6. The semiconductor package of claim 1, wherein the package substrate comprises a plurality of first contact pads, wherein the plurality of first contact pads is adjacent to and directly connect to the plurality of first frame vias.

7. The semiconductor package of claim 6, wherein the package substrate further comprises a plurality of second contact pads, wherein each second contact pad has a diameter or dimension larger than that of each first contact pad.

8. The semiconductor package of claim 1, wherein the printed circuit board comprises a recess for accommodating the second device.

9. The semiconductor package of claim 4, further comprising a passive component coupled to the second surface of the package substrate, wherein the passive component is arranged close to the extended redistribution frame and overlap with the extended redistribution frame at the extended frame portion.

10. The semiconductor package of claim 9, wherein the passive component comprises a capacitor, a resistor, an inductor, or a transformer.

11. The semiconductor package of claim 1, wherein the second device comprises a dynamic random-access memory (DRAM) semiconductive die or a dynamic random-access memory (DRAM) package, a semiconductive I/O tile, or a neural networking accelerator semiconductive die.

12. A computing device comprising:
a communication chip; and
a semiconductor package coupled to the communication chip, the semiconductor package comprising:
a package substrate with a first surface and an opposing second surface;
a first device coupled to the first surface of the package substrate;
a redistribution frame coupled to the second surface of the package substrate;
a plurality of solder balls coupled to the second surface of the package substrate;
a second device coupled to the redistribution frame; and
a printed circuit board coupled to the plurality of solder balls on the second surface of the package substrate, wherein the redistribution frame and the plurality of solder balls are positioned between the package substrate and the printed circuit board, wherein the redistribution frame comprises a plurality of first frame vias, wherein the plurality of first frame vias directly couple the redistribution frame to the second surface of the package substrate.

13. The computing device of claim 12, wherein the redistribution frame further comprises an extended frame portion.

14. The computing device of claim 12, wherein the printed circuit board comprises a recess for accommodating the second device.

15. The computing device of claim 12, wherein the second device comprises a dynamic random-access memory (DRAM) semiconductive die or a dynamic random-access memory (DRAM) package, a semiconductive I/O tile, or a neural networking accelerator semiconductive die.

16. A method comprising:
providing a package substrate with a top surface and a bottom surface;
coupling a first device to the top surface of the package substrate;
providing a plurality of solder balls on the bottom surface of the package substrate;
coupling a redistribution frame to the bottom surface of the substrate;
coupling a second device to the redistribution frame; and
coupling a printed circuit board to the plurality of solder balls on the bottom surface of the package substrate, wherein the redistribution frame and the plurality of solder balls are positioned between the package substrate and the printed circuit board, wherein the redistribution frame comprises a plurality of first frame vias, wherein the plurality of first frame vias directly couple the redistribution frame to the second surface of the package substrate.

17. The method of claim 16, wherein the redistribution frame further comprises a plurality of second frame vias, and one or more redistribution layers extending over the plurality of first and second frame vias.

18. The method of claim 16, further comprising forming an extended frame portion on the redistribution frame.

19. The method of claim 16, further comprising forming a recess in the printed circuit board for accommodating the second device.

* * * * *